United States Patent
Qi et al.

(10) Patent No.: US 9,673,262 B2
(45) Date of Patent: Jun. 6, 2017

(54) COA SUBSTRATE, DISPLAY DEVICE AND METHOD FOR MANUFACTURING COA SUBSTRATE

(71) Applicant: BOE TECHNOLOGY GROUP CO., LTD., Beijing (CN)

(72) Inventors: Yonglian Qi, Beijing (CN); Shi Shu, Beijing (CN); Guanbao Hui, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 202 days.

(21) Appl. No.: 14/425,488

(22) PCT Filed: Jul. 9, 2014

(86) PCT No.: PCT/CN2014/081880
§ 371 (c)(1),
(2) Date: Mar. 3, 2015

(87) PCT Pub. No.: WO2015/043281
PCT Pub. Date: Apr. 2, 2015

(65) Prior Publication Data
US 2016/0372522 A1     Dec. 22, 2016

(30) Foreign Application Priority Data
Sep. 29, 2013 (CN) .......................... 2013 1 0454684

(51) Int. Cl.
*H01L 27/32*     (2006.01)
*G02F 1/1362*     (2006.01)
(Continued)

(52) U.S. Cl.
CPC .......... *H01L 27/322* (2013.01); *G02F 1/1362* (2013.01); *H01L 27/3213* (2013.01);
(Continued)

(58) Field of Classification Search
CPC ............... H01L 27/322; H01L 27/3213; H01L 51/5206; H01L 51/5221; H01L 51/5012;
(Continued)

(56) References Cited

U.S. PATENT DOCUMENTS 6,824,935 B2 * 11/2004 Tanaka .............. G02F 1/133514
349/106
7,102,717 B2 * 9/2006 Chang ............... G02F 1/133555
349/106
(Continued)

FOREIGN PATENT DOCUMENTS

CN     101043048 A     9/2007
CN     101634789 A     1/2010
(Continued)

OTHER PUBLICATIONS

International Search Report and Written Opinion mailed Sep. 29, 2014 regarding PCT/CN2014/081880. Translation provided by Dragon Intellectual Property Law Firm.
(Continued)

*Primary Examiner* — William Coleman
(74) *Attorney, Agent, or Firm* — Harness, Dickey & Pierce, P.L.C.

(57) ABSTRACT

The present disclosure provides a COA substrate, a display device and a method for manufacturing the COA substrate. The COA substrate includes a base substrate, a TFT array arranged on the base substrate, a protective layer covering the TFT array, and a color filter including a color pixel and a white pixel, wherein the white pixel is made of a photoresist material.

20 Claims, 4 Drawing Sheets

(51) Int. Cl.
*H01L 51/00* (2006.01)
*H01L 51/50* (2006.01)
*H01L 51/52* (2006.01)
*H01L 51/56* (2006.01)

(52) U.S. Cl.
CPC ...... *H01L 27/3244* (2013.01); *H01L 27/3246* (2013.01); *H01L 51/0005* (2013.01); *H01L 51/5012* (2013.01); *H01L 51/5206* (2013.01); *H01L 51/5221* (2013.01); *H01L 51/5253* (2013.01); *H01L 51/56* (2013.01); *G02F 2001/136222* (2013.01); *H01L 2227/323* (2013.01); *H01L 2251/558* (2013.01)

(58) Field of Classification Search
CPC . H01L 51/5253; H01L 27/3246; H01L 51/56; H01L 51/0005
See application file for complete search history.

(56) References Cited

U.S. PATENT DOCUMENTS

| | | | | |
|---|---|---|---|---|
| 7,923,057 B2* | 4/2011 | Kurita | ............... | G02B 5/201 427/427.3 |
| 8,283,197 B2* | 10/2012 | Huang | ............... | H01L 29/78633 257/E31.122 |
| 8,643,812 B2* | 2/2014 | Choi | ............... | G02F 1/136286 349/123 |
| 8,659,723 B2* | 2/2014 | Park | ............... | G02F 1/133514 349/106 |
| 2011/0031517 A1 | 2/2011 | Huang et al. | | |

FOREIGN PATENT DOCUMENTS

| | | |
|---|---|---|
| CN | 101661204 A | 3/2010 |
| CN | 103258793 A | 8/2013 |
| CN | 103489893 A | 1/2014 |

OTHER PUBLICATIONS

Chinese Office Action mailed Jan. 29, 2015 regarding Chinese Application No. 201310454684.8. Translation provided by Dragon Intellectual Property Law Firm.

Third Office Action regarding Chinese application No. 201310454684.8, dated Jan. 19, 2016. Translation provided by Dragon Intellectual Property Law Firm.

* cited by examiner

COA SUBSTRATE, DISPLAY DEVICE AND METHOD FOR MANUFACTURING COA SUBSTRATE

CROSS-REFERENCE TO RELATED APPLICATION

The present application is the U.S. national phase of PCT Application No. PCT/CN2014/081880 filed on Jul. 9, 2014, which claims a priority of the Chinese patent application No. 201310454684.8 filed on Sep. 29, 2013, both of which are incorporated herein by reference in their entirety.

TECHNICAL FIELD

The present disclosure relates to the field of display technology, in particular to a COA substrate, a display device and a method for manufacturing the COA substrate.

BACKGROUND

A color filter on array (COA) technique includes manufacturing a color layer on an array substrate so as to form a color filter. FIG. 1 shows a basic structure of a COA substrate, where a thin film transistor (TFT), the color layer 4 and a pixel electrode 5 are sequentially formed on a base substrate 1, a protective layer 3 is arranged between a drain electrode 2 of the TFT and the color layer 4, a via-hole extending through the color layer 4 is arranged above the drain electrode 2, and the pixel electrode 5 is connected to the drain electrode 2 via the via-hole. For a display panel with the COA structure, it is unnecessary to align a color filter substrate with the array substrate, so it is able to reduce the difficulty in a procedure for arranging the color filter substrate and the array substrate opposite to each other to form a cell during the manufacture of the display panel and to prevent the occurrence of an error during the procedure. As a result, it is able to design a black matrix with a narrow line width, thereby to increase an aperture ratio.

Photolithography is used in the prior art to manufacture the COA substrate. In one way, after a RGB color layer is formed, a protective overcoat is applied onto the RGB color layer, so as to increase a thickness of the protective layer and replace a resin layer at a white pixel region. However, at this time, there is a relatively large segment difference between the white pixel region and a color pixel region. In another way, an exposing and developing process is required to be performed directly using a white resin material at the white pixel region. However, at this time, more materials and an additional process will be required, thus the production cost is increased.

SUMMARY

An object of the present disclosure is to provide a COA substrate, a display device and a method for manufacturing the COA substrate, so as to reduce a segment difference between a white pixel and a color pixel in an existing COA substrate.

In one aspect, the present disclosure provides a COA substrate, including:
a base substrate;
a TFT array arranged on the base substrate;
a protective layer covering the TFT array; and
a color filter including a color pixel and a white pixel, the white pixel is made of a photoresist material.

In another aspect, the present disclosure provides a display device including the above-mentioned COA substrate.

In yet another aspect, the present disclosure provides a method for manufacturing a COA substrate, including steps of:
providing a base substrate;
arranging a TFT array on the base substrate;
forming a protective layer to cover the TFT array;
applying a photoresist onto the protective layer;
reserving the photoresist at a white pixel region and removing the photoresist at a color pixel region; and
forming a color layer at the color pixel region by inkjet printing.

The present disclosure has the following advantageous effects. According to the COA substrate of the present disclosure, after being applied onto the protective layer, the photoresist at the white pixel region is reserved so as to form the white pixel by the photoresist material. The photoresist at the color pixel region is removed and the color layer is formed at the color pixel region by inkjet printing so as to provide a relatively small segment difference between the white pixel region and the color pixel region obtained by spraying. As a result, it is unnecessary to perform an exposing and developing process using a white resin material, and thereby it is able to reduce the production cost.

DETAILED DESCRIPTION

In order to make the objects, the technical solutions and the advantages of the present disclosure more apparent, the present disclosure will be described hereinafter in conjunction with the drawings and embodiments.

Figure 1:
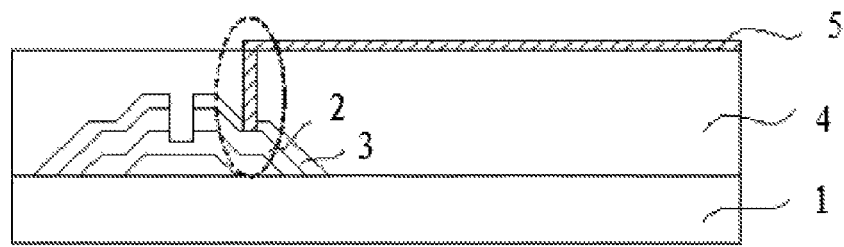
FIG. 1 is a schematic view showing an existing COA substrate.
Figure 2:
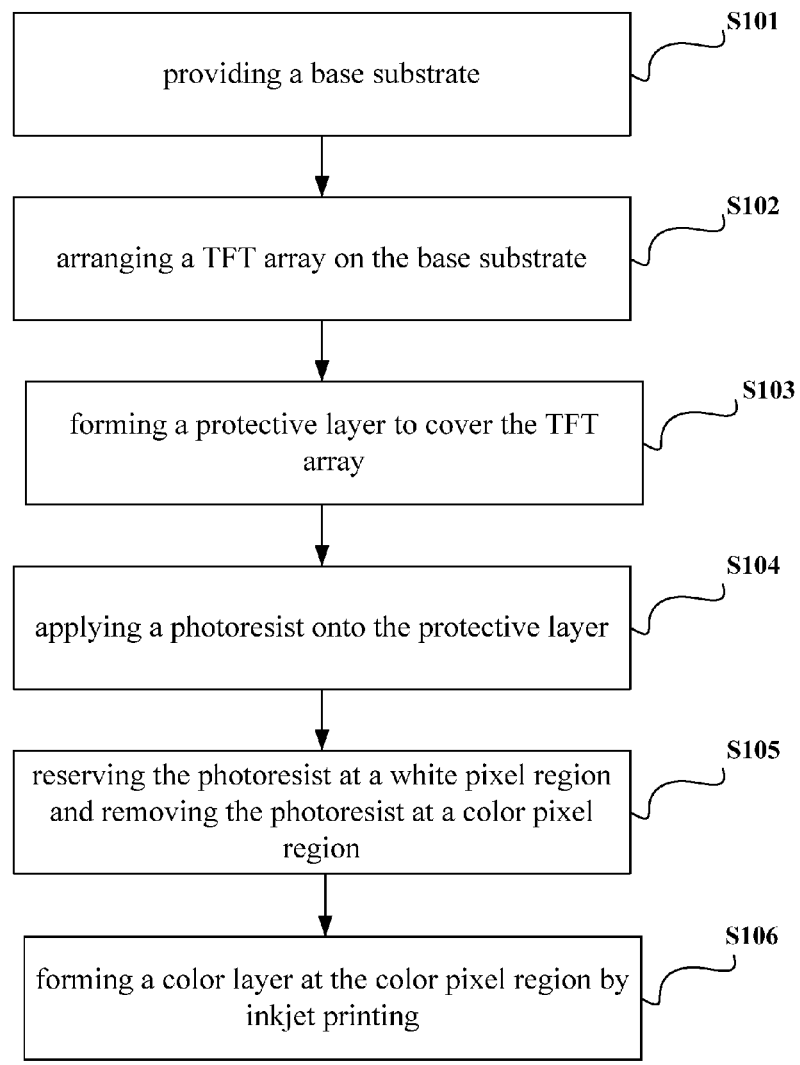
FIG. 2 is a flow chart of a method for manufacturing a COA substrate according to an embodiment of the present disclosure.

As shown in FIG. 2, it is a flow chart of a method for manufacturing a COA substrate according to an embodiment of the present disclosure. The method includes the following steps:

Step S101: providing a base substrate;
Step S102: arranging a TFT array on the base substrate;
Step S103: forming a protective layer to cover the TFT array;

Step S104: applying a photoresist onto the protective layer;

Step S105: reserving the photoresist at a white pixel region and removing the photoresist at a color pixel region; and Step S106: forming a color layer at the color pixel region by inkjet printing.

According to the COA substrate in this embodiment, after being applied onto the protective layer, the photoresist at the white pixel region is removed so as to form a white pixel by a photoresist material. The photoresist at the color pixel region is removed, and a color layer is formed at the color pixel region by inkjet printing, so as to provide a relatively small segment difference between the white pixel region and the color pixel region obtained by spraying. As a result, it is unnecessary to perform an exposing and developing process using a white resin material, and thereby it is able to reduce the production cost.

The base substrate in this embodiment may be one selected from the group consisting of a glass substrate, a metal substrate, a quartz substrate and an organic substrate. A plurality of TFTs is arranged on the base substrate, and the protective layer is formed so as to cover the TFT array. Subsequent to the formation of the protective layer, the photoresist is applied onto the protective layer. Preferably, the photoresist is colorless and of a high transmittance, and its thickness may be set in accordance with the practical need, e.g., within a range of 1.5 μm to 5 μm.

The photoresist at a via-hole region and the color pixel region on the protective layer is subjected to full exposure treatment, so as to form a photoresist unreserved region. After the exposure, the photoresist unreserved region is developed and postbaked so as to remove the photoresist at this region. The photoresist at the white pixel region is subjected to exposure or partial exposure treatment so as to form the white pixel by the photoresist material.

The color layer may be a RGB layer formed by inkjet printing, i.e., RGB inks are printed at the color pixel region and then cured to form the color layer. The inks are sprayed at the color pixel region by means of retaining walls formed by the photoresist, so as to provide a relatively small segment difference between the white pixel region and the color pixel region obtained by spraying. As a result, it is unnecessary to perform an exposing and developing process using the white resin material, and thereby it is able to reduce the production cost.

Subsequent to forming the COA substrate, the method further includes steps of forming an anode, a pixel delimiting layer (PDL), a light-emitting layer (EL) and a cathode.

The present disclosure will be described hereinafter in details in conjunction with the following embodiments.

First Embodiment

Figure 3A:
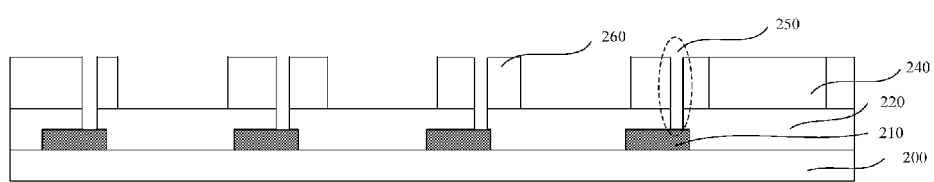
FIG. 3(a) is a schematic view showing the COA substrate in a first state according to the first embodiment of the present disclosure.

Referring to FIG. 3(a), which is a schematic view showing the COA substrate in a first state, this structure includes a base substrate 200, a TFT array 210 and a protective layer 220. This structure is manufactured by the steps of arranging the TFT array 210 on the base substrate 200, forming the protective layer 220 on the TFT array 210 and applying a photoresist onto the protective layer 220.

Subsequent to applying the photoresist, as shown in FIG. 3(a), the base substrate with the photoresist is exposed so as to form a photoresist fully-reserved region, a photoresist partially-reserved region and a photoresist unreserved region. The photoresist partially-reserved region corresponds to a subsequently-formed color pixel region 230, and the photoresist unreserved region corresponds to a region where a via-hole 250 is to be formed subsequently. The protective layer is etched at the via-hole region by an etching process, so as to form the via-hole 250. The via-hole 250 is used to connect a subsequently-formed OLED anode and a drain electrode of a TFT, thereby to control a light-emitting layer to emit light. The photoresist fully-reserved region corresponds to a white pixel region 240 and a photoresist retaining wall 260 surrounding the color pixel region 230. The photoresist retaining wall 260 is configured to prevent color mixture of adjacent color pixels when the color pixel region is formed by inkjet printing.

Figure 3B:
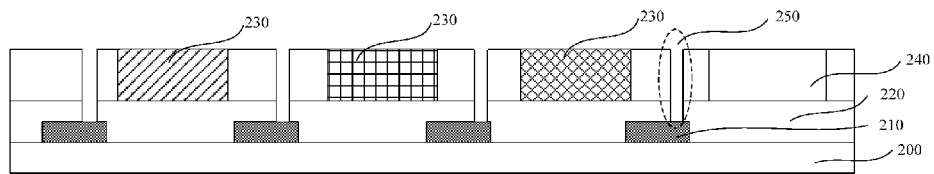
FIG. 3(b) is a schematic view showing the COA substrate in a second state according to the first embodiment of the present disclosure.

Referring to FIG. 3(b), which is a schematic view showing the COA substrate in a second state, this structure is obtained by forming the color pixels on the basis of the structure in the first state. The color pixels are formed at the color pixel region by inkjet printing, i.e., RGB inks are printed at the color pixel region so as to form the color layer. Due to a relatively small segment difference between the color pixel region and the white pixel region, the planarization between the color pixel region and the white pixel region is better.

In this embodiment, after the inkjet printing, a difference between a thickness of the color pixel region and a thickness of the photoresist is within a predetermined threshold range. At this time, the thickness of the color pixel region is equal to, or approximately equal to, the thickness of the photoresist. As a result, it is unnecessary to apply a protective overcoat, and thereby an additional process of applying a overcoat will be omitted.

As an illustrative example, the predetermined threshold range is −0.5 μm to 0.5 μm. As another illustrative example, the thickness of the color pixel region is equal to the thickness of the surrounding photoresist.

Figure 3C:
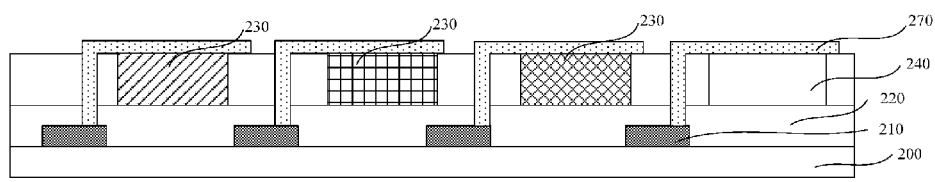
FIG. 3(c) is a schematic view showing the COA substrate in a third state according to the first embodiment of the present disclosure.
Figure 3D:
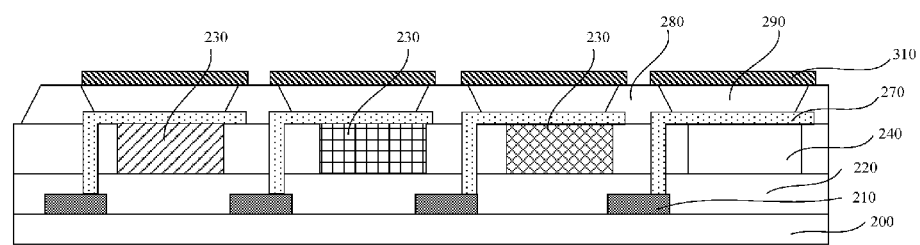
FIG. 3(d) is a schematic view showing the COA substrate in a fourth state according to the first embodiment of the present disclosure.

After the COA substrate is manufactured, an anode 270, a pixel delimiting layer (PDL) 280, a light-emitting layer (EL) 290 and a cathode 310 may be formed on the COA substrate. FIG. 3(c) shows the structure with the anode 270, and FIG. 3(d) shows the structure with the pixel delimiting layer 280 and the light-emitting layer 290 and the cathode 310.

Second Embodiment

Figure 4A:
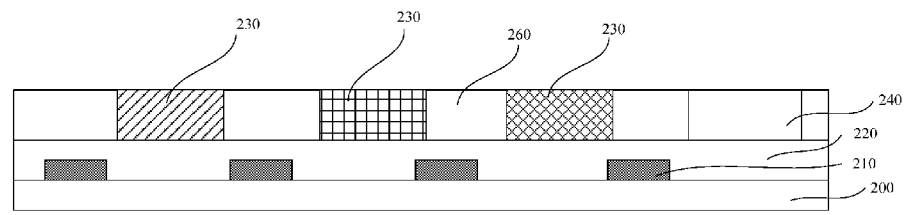
FIG. 4(a) is a schematic view showing the COA substrate in a first state according to the second embodiment of the present disclosure.

Referring to FIG. 4(a), which is a schematic view showing the COA substrate in a first state, a structure of the first state includes the base substrate 200, the TFT array 210 and the protective layer 220. The structure of the first state is manufactured by the steps of arranging the TFT array 210 on the base substrate 200, forming the protective layer 220 on the TFT array 210 and applying the photoresist onto the protective layer 220.

Subsequent to applying the photoresist, the base substrate is subjected to half-exposure and development so as to form a photoresist unreserved region corresponding to the color pixel region 230 and the via-hole 250, and a photoresist partially-reserved region corresponding to the white pixel region. The photoresist for forming the white pixels may be of a thickness of 2 to 3 μm, e.g., equal to the thickness of the color pixel. Next, the color layer is formed at the color pixel region 230 by inkjet printing, so as to form the color filter. Due to a relatively small segment difference between the color layer and the photoresist at the white pixel region, the planarization between the color layer and the white pixel region is better.

Figure 4B:
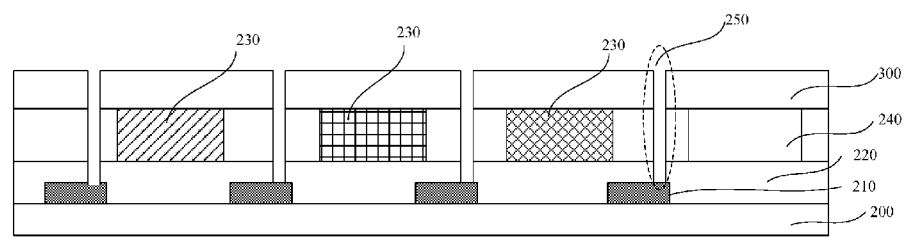
FIG. 4(b) is a schematic view showing the COA substrate in a second state according to the second embodiment of the present disclosure.

A overcoat 300 may be arranged on the white pixel region and the color layer, so as to provide an overcoat. Subsequent to forming the overcoat, the via-hole 250 is formed therein, as shown in FIG. 4(b).

After the COA is manufactured, the anode, the pixel delimiting layer (PDL), the light-emitting layer (EL) and the cathode may be formed on the COA substrate.

Referring to FIG. 3(b), which is a schematic view showing the COA substrate according to the first embodiment, the COA substrate includes:

the base substrate 200;
the TFT array 210 arranged on the base substrate 200;
the protective layer 220 covering the TFT array 210;
the color filter including the color pixel 230 and the white pixel 240, the white pixel being made of a photoresist material, the color pixel being formed by inkjet printing, and the photoresist retaining wall 260 being formed around the color pixel; and
the via-hole 250 arranged at the via-hole region.

In this embodiment, after the inkjet printing, a difference between a thickness of the color pixel and a thickness of the photoresist is within a predetermined threshold range. At this time, the thickness of the color pixel is equal to, or approximately equal to, the thickness of the photoresist. As a result, it is unnecessary to apply a protective overcoat, and thereby an additional step of applying the overcoat will be omitted. For example, the predetermined threshold range is −0.5 μm to 0.5 μm, or the thickness of the color pixel is equal to the thickness of the surrounding photoresist.

Due to a relatively small segment difference between the color layer and the photoresist at the white pixel region, the planarization between the color layer and the white pixel region is better.

Referring to FIG. 4(b), which is a schematic view showing the COA substrate according to the second embodiment, the COA substrate includes:

the base substrate 200;
the TFT array 210 arranged on the base substrate 200;
the protective layer 220 covering the TFT array 210;
the color filter including the color pixel 230 and the white pixel 240, the white pixel being made of a photoresist material, the color pixel being formed by inkjet printing, and the photoresist retaining wall 260 being formed around the color pixel;
the via-hole 250 arranged at the via-hole region; and
the overcoat 300 arranged on the color filter.

Due to a relatively small segment difference between the color layer and the photoresist at the white pixel region, the planarization between the color layer and the white pixel region is better. After the protective overcoat is applied, the planarization can be performed in a better manner, thereby to prevent a too large segment difference between the color pixel region and the white pixel region.

According to the COA substrate in these embodiments, the white pixel region is made of the photoresist material, and the photoresist is formed around the color pixel region. The color pixel is formed by inkjet printing at the color pixel region by means of the photoresist retaining wall formed by the photoresist, so as to provide a relatively small segment difference between the white pixel region and the color pixel region obtained by spraying. As a result, it unnecessary to perform an exposing and developing process using white resin material, and thereby it is able to reduce the production cost.

The present disclosure further provides a display device including the COA substrate.

According to the display device of the present disclosure, after being applied onto the protective layer, the photoresist at the white pixel region is reserved so as to form the white pixel by the photoresist material. The photoresist at the color pixel region is subjected to full exposure treatment, and inks are sprayed at the color pixel region by means of the photoresist retaining wall formed by the photoresist, so as to provide a relatively small segment difference between the white pixel region and the color pixel region formed by spraying. As a result, it is unnecessary to perform an exposing and developing process by using a white resin material, and thereby it is able to reduce the production cost.

The above are merely the preferred embodiments of the present disclosure. It should be appreciated that, a person skilled in the art may make further modifications and improvements without departing from the principle of the present disclosure, and these modifications and improvements shall also fall within the scope of the present disclosure.

What is claimed is:

1. A color filter on array (COA) substrate, comprising:
a base substrate;
a thin film transistor (TFT) array arranged on the base substrate;
a protective layer covering the TFT array; and
a color filter arranged on the protective layer such that the protective layer is between the base substrate and the color filter, the color filter comprising a color pixel and a white pixel,
wherein the white pixel is made of a photoresist material, and
a photoresist retaining wall is formed around the color pixel.

2. The COA substrate according to claim 1, wherein a difference between a thickness of the color pixel and a thickness of the photoresist retaining wall is within a predetermined threshold range.

3. The COA substrate according to claim 1, further comprising an overcoat arranged on the color filter.

4. The COA substrate according to claim 1, further comprising an anode and a cathode.

5. A display device comprising the COA substrate according to claim 1.

6. The COA substrate according to claim 2 wherein the predetermined threshold range is −0.5 μm to 0.5 μm.

7. The COA substrate according to claim 2, further comprising:
an overcoat arranged on the color filter.

8. The COA substrate according to claim 2, further comprising an anode and a cathode.

9. The COA substrate according to claim 6, further comprising:
an overcoat arranged on the color filter.

10. The COA substrate according to claim 3, further comprising an anode and a cathode.

11. The COA substrate according to claim 4, further comprising a pixel delimiting layer.

12. The COA substrate according to claim 4, further comprising a light-emitting layer arranged between the anode and the cathode.

13. The COA substrate according to claim 6, further comprising an anode and a cathode.

14. A method for manufacturing a COA substrate, comprising:
providing a base substrate;
arranging a TFT array on the base substrate;
forming a protective layer so as to cover the TFT array;

applying a photoresist onto the protective layer;
reserving the photoresist at a white pixel region and removing the photoresist at a color pixel region; and
forming a color layer at the color pixel region by inkjet printing.

15. The method according to claim 14 wherein a difference between a thickness of the color layer and a thickness of the photoresist is within a predetermined threshold range.

16. The method according to claim 14, further comprising:
forming an overcoat on a white pixel covered with the photoresist and the color layer.

17. The method according to claim 15, wherein the predetermined threshold range is −0.5 μm to 0.5 μm.

18. The method according to claim 15, further comprising:
forming an overcoat on a white pixel covered with the photoresist and the color layer.

19. The method according to claim 16, further comprising:
forming a via-hole at a via-hole region corresponding to the overcoat.

20. The method according to claim 17, further comprising:
forming an overcoat on a white pixel covered with the photoresist and the color layer.

* * * * *